(12) United States Patent
Sugino et al.

(10) Patent No.: US 11,430,689 B2
(45) Date of Patent: Aug. 30, 2022

(54) INTER-LAYER INSULATOR FOR ELECTRONIC DEVICES AND APPARATUS FOR FORMING SAME

(71) Applicant: Cypress Semiconductor Corporation, San Jose, CA (US)

(72) Inventors: Rinji Sugino, San Jose, CA (US); Fei Wang, San Jose, CA (US)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 16/154,907

(22) Filed: Oct. 9, 2018

(65) Prior Publication Data
US 2019/0043751 A1 Feb. 7, 2019

Related U.S. Application Data

(63) Continuation of application No. 13/682,826, filed on Nov. 21, 2012, now abandoned.

(51) Int. Cl.
*H01L 21/764* (2006.01)
(52) U.S. Cl.
CPC .................... *H01L 21/764* (2013.01)
(58) Field of Classification Search
CPC ............ H01L 21/764; H01L 21/76898; H01L 21/7682; H01L 21/767; H01L 21/50; H01L 21/7688; H01L 2224/05
USPC .................................................. 257/522, 774
See application file for complete search history.

(56) References Cited

U.S. PATENT DOCUMENTS

| | | | | |
|---|---|---|---|---|
| 5,461,003 A * | 10/1995 | Havemann | ........ | H01L 21/02126 257/E21.581 |
| 6,159,842 A * | 12/2000 | Chang | ............... | H01L 21/76801 216/2 |
| 6,524,944 B1 * | 2/2003 | Rangarajan | ......... | H01L 21/7682 257/642 |
| 2004/0245586 A1 * | 12/2004 | Partridge | ............ | B81C 1/00301 257/414 |
| 2005/0037604 A1 * | 2/2005 | Babich | ................ | H01L 21/7681 438/619 |
| 2005/0124089 A1 | 6/2005 | Gogoi et al. | | |
| 2005/0260783 A1 * | 11/2005 | Lutz | ..................... | B81B 3/0005 438/51 |

(Continued)

FOREIGN PATENT DOCUMENTS

| | | |
|---|---|---|
| JP | 2011503840 | 1/2011 |
| JP | 2012222142 | 11/2012 |

OTHER PUBLICATIONS

U.S. Appl. No. 13/682,826: "Inter-Layer Insulator for Electronic Devices and Apparatus for Forming Same ," Rinji Sugino et al., filed Nov. 21, 2012 ; 32 pages.

(Continued)

*Primary Examiner* — Dzung Tran

(57) ABSTRACT

A semiconducting device utilizing air-gaps for inter-layer insulation and methods of producing the device are described. The device may be produced by forming a sacrificial layer between two structures. A porous membrane layer is then formed over the sacrificial layer. The membrane layer is porous to an etch product, which allows for the subsequent etching of the sacrificial layer leaving an air gap between the device structures and the membrane intact. The device may also include a cap layer formed above the device structures and the membrane.

20 Claims, 12 Drawing Sheets

(56) References Cited

U.S. PATENT DOCUMENTS

| | | | |
|---|---|---|---|
| 2008/0105951 A1* | 5/2008 | Sato | B81C 1/00246 257/619 |
| 2009/0243108 A1 | 10/2009 | Gosset et al. | |
| 2009/0267166 A1 | 10/2009 | Maria et al. | |
| 2009/0280644 A1 | 11/2009 | Zenasni | |
| 2011/0108989 A1 | 5/2011 | Clevenger et al. | |
| 2011/0163399 A1 | 7/2011 | Witvrouw et al. | |
| 2011/0195568 A1* | 8/2011 | Wang | H01L 21/486 438/613 |
| 2012/0013022 A1 | 1/2012 | Tezcan et al. | |

OTHER PUBLICATIONS

International Search Report for International Application PCT/US2013/070309 dated Feb. 26, 2014; 3 pages.

Sugino, R., et al., "A Formation of Si Native Oxide Membrane Using High-Selectivity Etching and Applications for Nano-Pipe Array and Micro-Diaphragm on Si Substrate," International Electron Devies Meeting (IEDM '06), Dec. 2006; pp. 1-4.

USPTO Advisory Action for U.S. Appl. No. 13/682,826 dated Sep. 30, 2015; 3 pages.

USPTO Advisory Action for U.S. Appl. No. 13/682,826 dated Oct. 16, 2017; 3 pages.

USPTO Advisory Action for U.S. Appl. No. 13/682,826 dated Aug. 23, 2016; 3 pages.

USPTO Final Rejection for U.S. Appl. No. 13/682,826 dated Jun. 8, 2016; 14 pages.

USPTO Final Rejection for U.S. Appl. No. 13/682,826 dated Jul. 11, 2018; 11 pages.

USPTO Final Rejection for U.S. Appl. No. 13/682,826 dated Aug. 12, 2015; 9 pages.

USPTO Final Rejection for U.S. Appl. No. 13/682,826 dated Sep. 21, 2017; 8 pages.

USPTO Non-Final Rejection for U.S. Appl. No. 13/682,826 dated Jan. 11, 2018; 11 pages.

USPTO Non-Final Rejection for U.S. Appl. No. 13/682,826 dated Jan. 19, 2016; 8 pages.

USPTO Non-Final Rejection for U.S. Appl. No. 13/682,826 dated Apr. 10, 2017; 12 pages.

USPTO Non-Final Rejection for U.S. Appl. No. 13/682,826 dated Jul. 31, 2014; 9 pages.

Written Opinion of the International Searching Authority for International Application No. PCT/US2013/070309 dated Feb. 26, 2014; 7 pages.

* cited by examiner

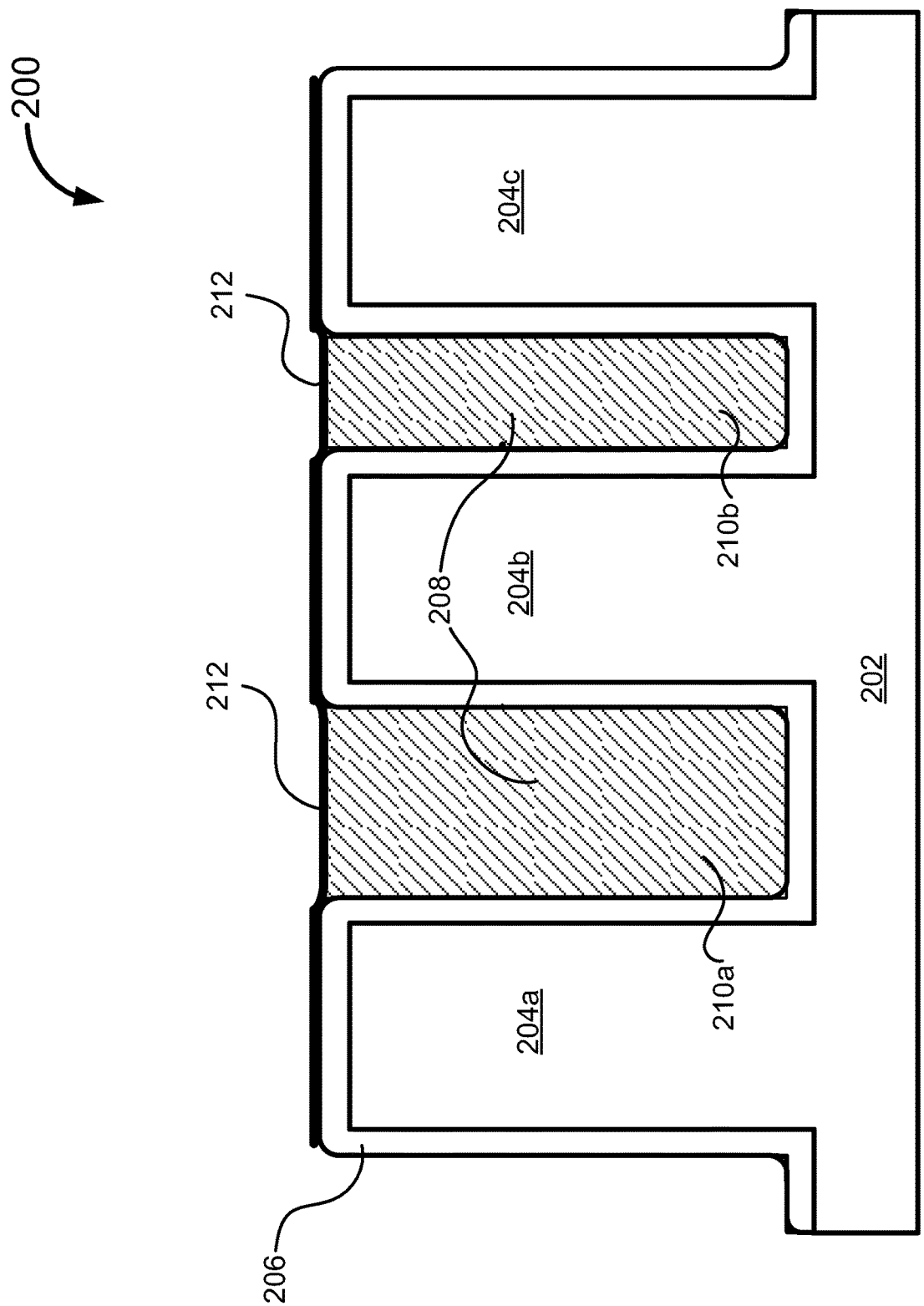

INTER-LAYER INSULATOR FOR ELECTRONIC DEVICES AND APPARATUS FOR FORMING SAME

PRIORITY

The present application is a continuation and claims the benefit of priority of co-pending U.S. application Ser. No. 13/682,826 filed Nov. 21, 2012, which is incorporated by reference herein.

TECHNICAL FIELD

This disclosure relates generally to semiconductor products that employ air gaps as inter-layer insulators, and methods and apparatus for making such semiconductor products.

BACKGROUND

Modern semiconductor devices may include vast numbers of individual structures or components disposed on one or more layers. To ensure that a semiconducting device functions properly, most, if not all, of the individual structures or components need to be electrically isolated from each other. Traditionally, such isolation is accomplished through the use of materials such as dielectric films to act as inter-layer insulators between the various components that make up a typical device. However, as device size decreases, the existing materials have been found to result in a number of problems such as leakage, noise, and a capacitive effect, for example. One approach used to ameliorate the problems associated with the use of dielectric materials as insulators has been to instead use air gaps as insulators.

Existing methods for forming air gaps and using them as insulation have drawbacks. For instance, existing methods of air-gap formation rely on the so-called "pinching method" whereby a non-conformal (i.e., uneven) film deposition over structures of a semiconducting device is used to create an air gap. In short, this works by depositing the dielectric film more thickly at the top of the structures and more thinly towards the base of the structure. When two structures are adjacent to each other, the thick parts of the film touch at a "pinch point" thereby closing off an air gap beneath the pinch point. However, air gaps created through the pinching method still suffer from various problems. For instance, such air gaps can have problems associated with noise coupling and leakage through pinching portions. Additionally, the pinching method is dependent on the physical layout of the structures that form the semiconductor device; malformed air gaps can be produced when the individual structures are too close or too far from one another. There are also other uncontrollable aspects of the deposition process and the fabrication process that can result in malformed air gaps. Accordingly, new devices and methods as well as method and apparatuses for producing such devices that do not suffer from the same drawbacks as the existing methods are desired.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to, explain the principles of the invention and to enable a person skilled in the relevant art(s) to make and use the invention.

FIGS. 2a-2i illustrate a semiconductor device after performing various steps in the manufacture process according to embodiments of the present invention.

Figure 1:
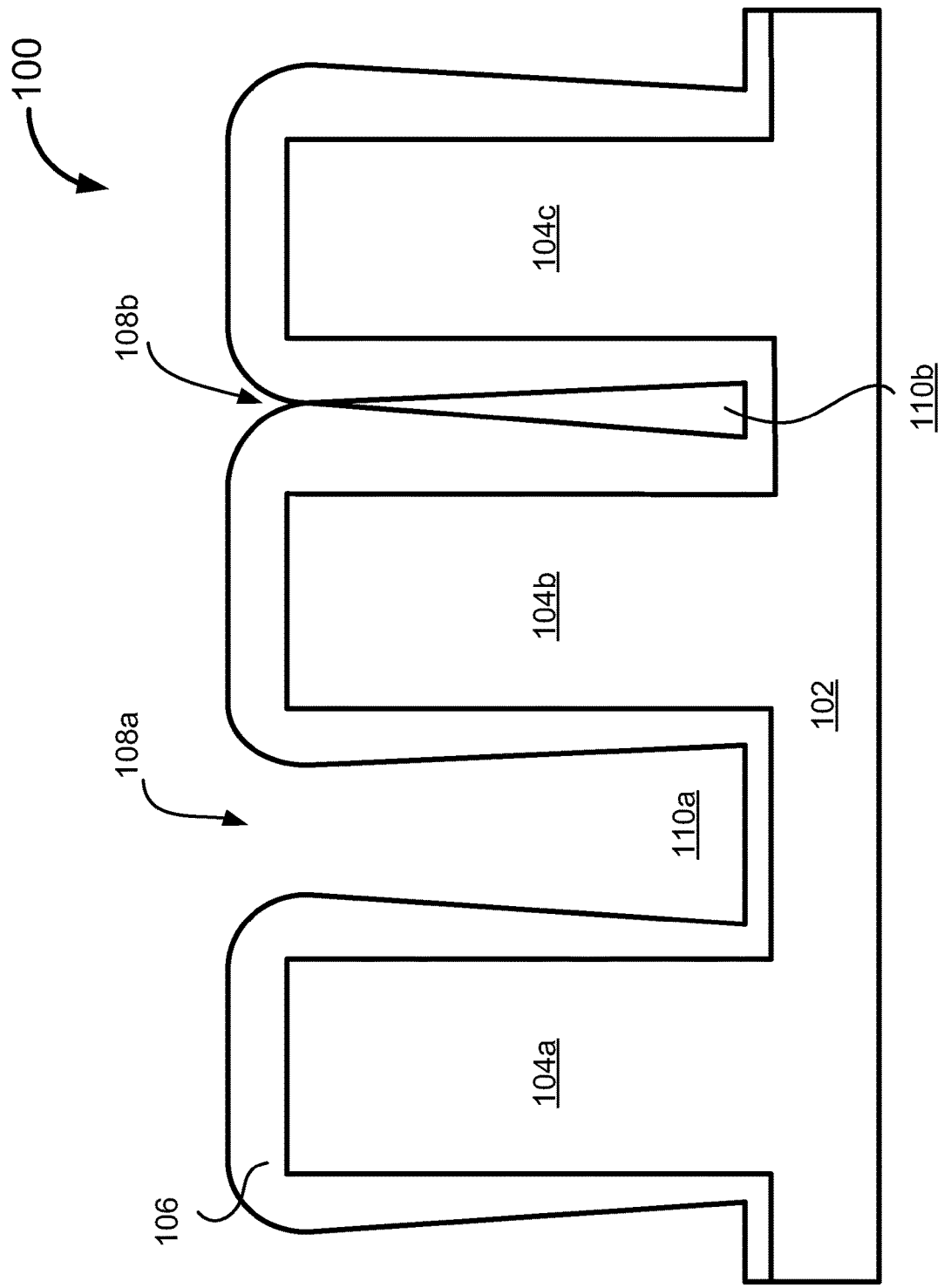
FIG. 1 illustrates a semiconductor device with air gaps created according to the pinch method.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The following detailed description refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

Summary of Disclosed Embodiments

Embodiments of the invention include apparatuses and methods of producing semiconductor devices that use air gaps as electrical insulators Embodiments also include such semiconductor devices. According to some embodiments, the method may include forming a sacrificial layer between a first structure and a second structure. A membrane layer may be formed over the sacrificial layer. Preferably, the membrane may be porous to an etch product. The sacrificial layer may then be etched away to create an air gap without etching the membrane layer or the buffer layer. A cap layer may be disposed on top of the membrane layer according to various embodiments. According to some embodiments, a buffer layer may be formed between the sacrificial layer and the first and second structures.

According to some embodiments of the invention, a semiconducting device that uses air gaps as electrical insulators is provided. The device may include an air gap insulator disposed between a first and second structure of the semiconducting device. The device also includes a membrane layer disposed above the air gap and between the first and second structures. The membrane layer is porous to an etching product that is capable of etching the sacrificial layer without etching the membrane layer. According to various embodiments, the device may also include a cap layer disposed on top of the membrane layer. A buffer layer may be formed between the first and second structures and the air gap.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only Additional embodiments will be apparent to a person skilled in the relevant art(s) based on the teachings contained herein.

FIG. 1 illustrates a semiconducting device with air gap insulators produced according to an existing non-conformal "pinching method." The device 100 includes a number of structures 104a, 104b, and 104c (collectively referred to herein as structures 104). The structures 104 are disposed on top of a base 102, which may comprise a semiconductor substrate. Between each of the structures 104 is a gap 110a, 110b which separates the structures 104 from each other. Additionally, the structures 104 may have a buffer layer 106 disposed on top of them. In this case, it can be seen that buffer layer 106 is non-conformally deposited. A conformal film is a film that is deposited on an uneven surface, but that has an even thickness. While few films are truly conformal when deposited (due to slight uncontrollable variations in their thickness), as used herein, conformal refers to films that have substantially even thicknesses. Non-conformal films, conversely, are films that have an uneven thickness—i.e., they are thicker at some points and thinner at others. Buffer layer 106 as depicted in FIG. 1 is such a non-conformal film because, as can be seen, it is thicker toward the top of structures 104 and thinner toward the base 102. Typically, buffer layer 106 comprises dielectric material such as $SiO_2$.

As shown in FIG. 1, the structures 104a, 104b, and 104c may not be evenly spaced, which can result in errors and inconsistencies in the production process when using the pinching method. For instance, as depicted in FIG. 1, gap 110a is open at the top because the buffer layer 106 does not touch as it should at point 108a. Thus, an air gap is not properly formed between the structures, 104a and 104b. Gap 110b, on the other hand, is closed by the "pinching" of the buffer layer 106 between structures 104b and 104c at pinch point 108b. Thus, an air gap 110b is properly formed between structures 104b and 104c (although other problems may exist such as leakage or unwanted capacitance at pinch point 108b).

Stated another way, there is no pinch point associated with air gap 110a because the distance between structure 104a and 104b is greater than the thickness of the buffer layer 106 covering structures 104a and 104b. Thus, the buffer layer 106 cannot "pinch" at a pinch point. As can be seen, the "pinching" method is dependent, to a certain extent, on the physical dimensions of the various structures 104 that form the semiconducting device 100. While gap 110a may constitute an air gap and it can insulate structure 104a from 104b, the open top can sometimes foreclose the possibility of another layer, such as a cap layer, being formed over the gap 110a at point 108a. As depicted in FIG. 1, the efficacy of the pinch method of creating air gaps is, at least in part, dependent on the actual physical geometry of the semiconducting device. It would be desirable to have a method of creating air gaps that is independent of the physical geometry of the semiconducting device.

Figure 2A:
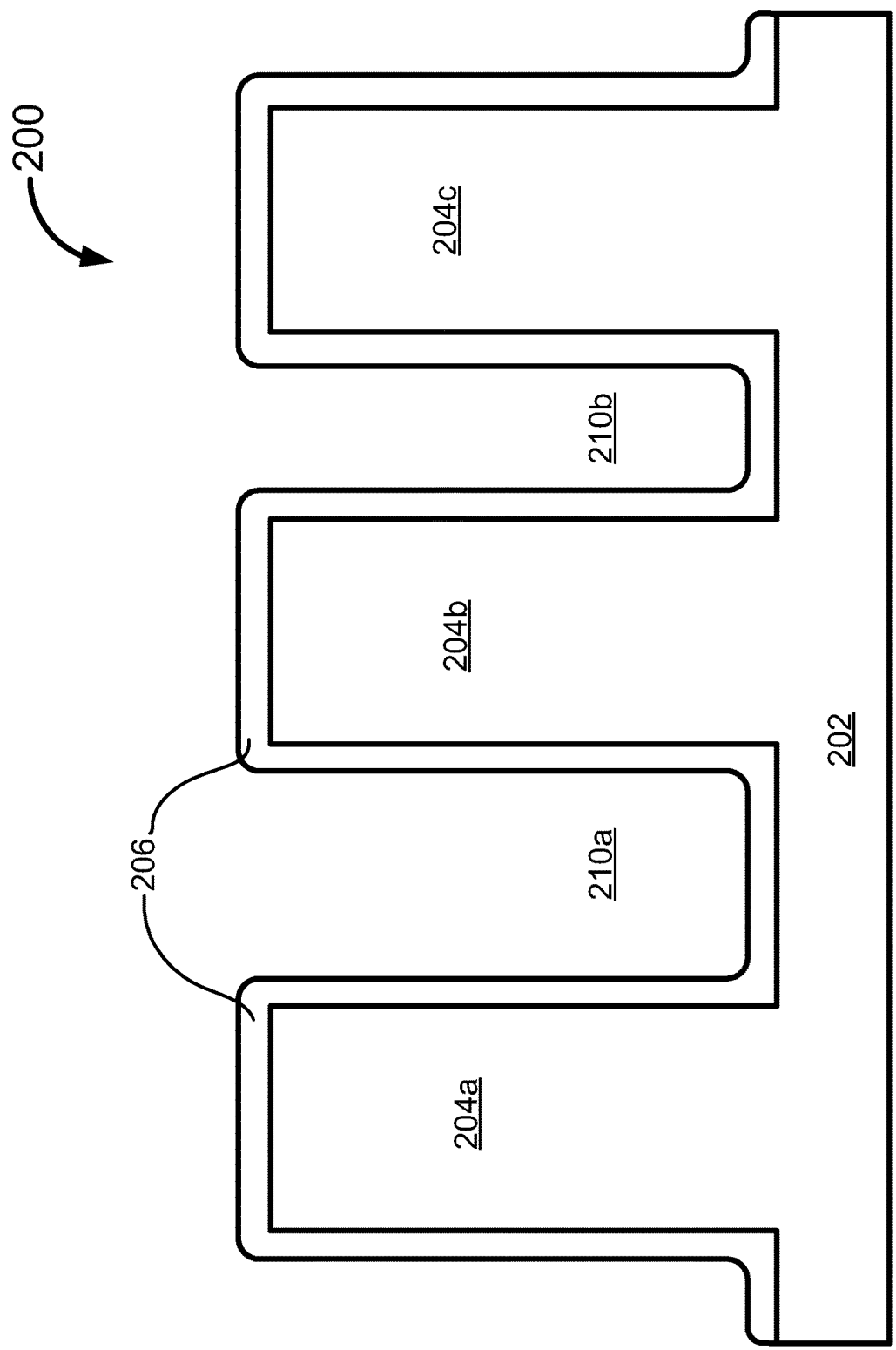

FIGS. 2a-2f depict a semiconducting device 200 with air gaps as insulators. Semiconductor 200 may be formed using a manufacturing process according to embodiments of the present invention. FIG. 2a depicts device 200 that includes a number of different structures 204a, 204b, and 204c (hereinafter collectively referred to as structures 204). The structures 204 could be, for instance, any combination of various circuit components such as transistors, capacitors, electrodes, contacts, interconnects, etc. Indeed, the structures 204 may include any device component that requires electrical insulation from its neighboring components.

The structures 204 are disposed on a base 202, which may comprise a semiconducting substrate, the top of another layer of device components, or the like. Additionally, gaps 210a and 210b (collectively referred to as gaps 210, herein) are positioned between structures 204a and 204b and between structures 204b and 204c, respectively.

As shown in FIG. 2a, a buffer layer 206 is disposed over the structures 204. The buffer layer 206 may comprise a suitable dielectric film composed of, for instance, silicon dioxide ($SiO_2$) that is conformally formed on top of the structures 204. According to some embodiments, the buffer layer 206 may be formed using any of the well-known method such as deposition. Deposition may comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others. Any of these methods may be used according to various embodiments. The buffer layer 206 may be used in embodiments where additional protection is required for structures 204 is required during etching of the sacrificial layer 208. This is required, for instance, when the etching product that is used to etch the sacrificial layer 208 would also etch structures 204. The buffer layer 206 either does not react with the etch product at all or reacts at a slower rate than, with the etch product, than sacrificial layer 208. Accordingly, the buffer layer 206 serves to isolate the structures 204 from the effects of the etching products or chemicals.

Figure 2B:
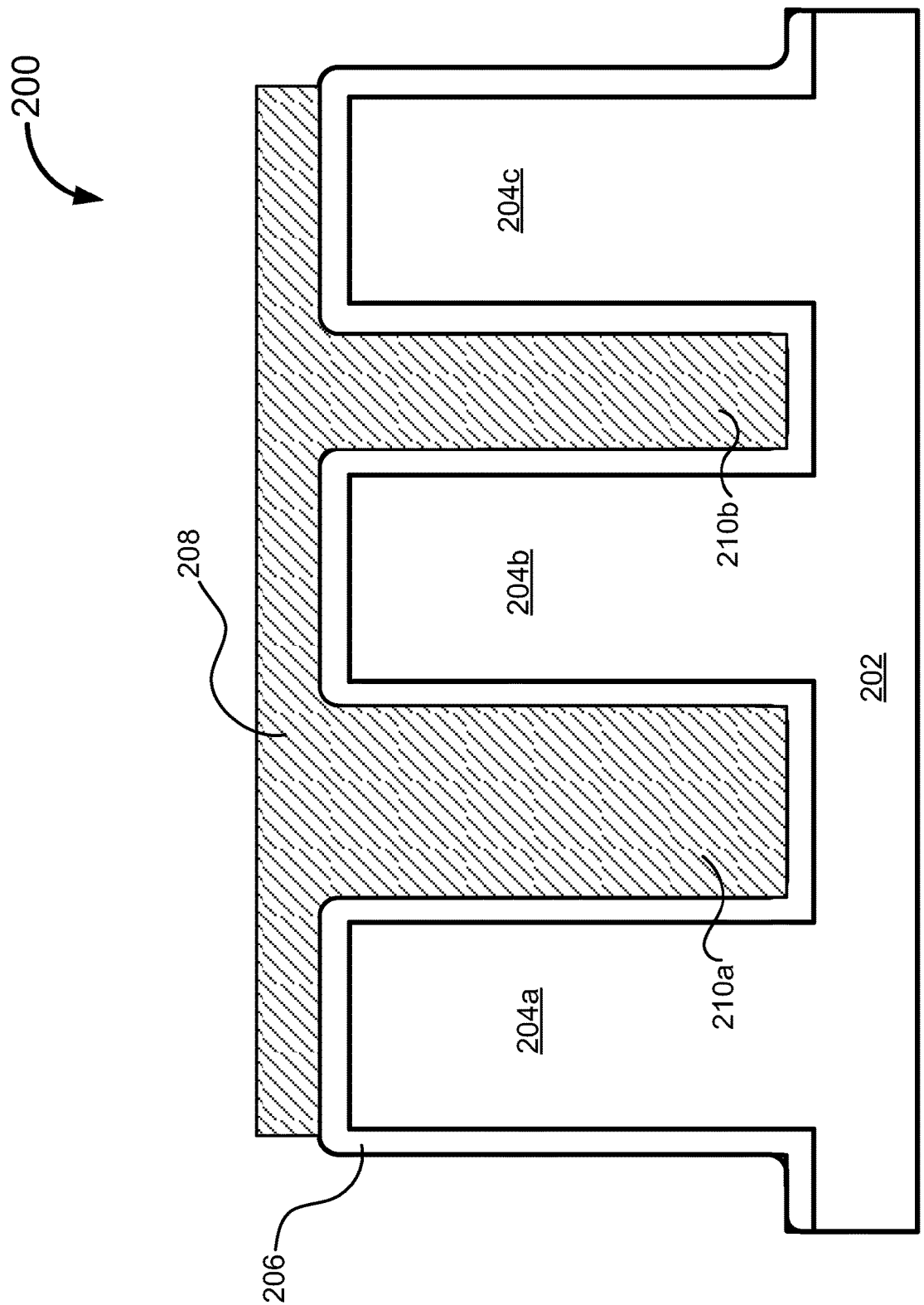

FIG. 2b depicts the device 200 after a sacrificial layer 208 has been formed on top of the structures 204 and between them in gaps 210a and 210b. In an embodiment, the sacrificial layer 208 comprises a material that has etching selectivity (i.e., can be etched separately) with the buffer layer 206. In other words, sacrificial layer 208 and buffer layer 206 are formed from different materials such that etching products may etch one but not the other. According to various embodiments, the sacrificial layer 208 may comprise silicon (Si), aluminum (Al), germanium (Ge), or an organic film such as photo resist. As shown in FIG. 2b, the same material is used for the sacrificial layer 208 to fill in gaps 210a and 210b. According to some embodiments, different materials may be used for different gaps. For instance, silicon could be used as the sacrificial layer 208 for gap 210a and photoresist as the sacrificial layer 208 for gap 210b, according to some embodiments.

Figure 2C:
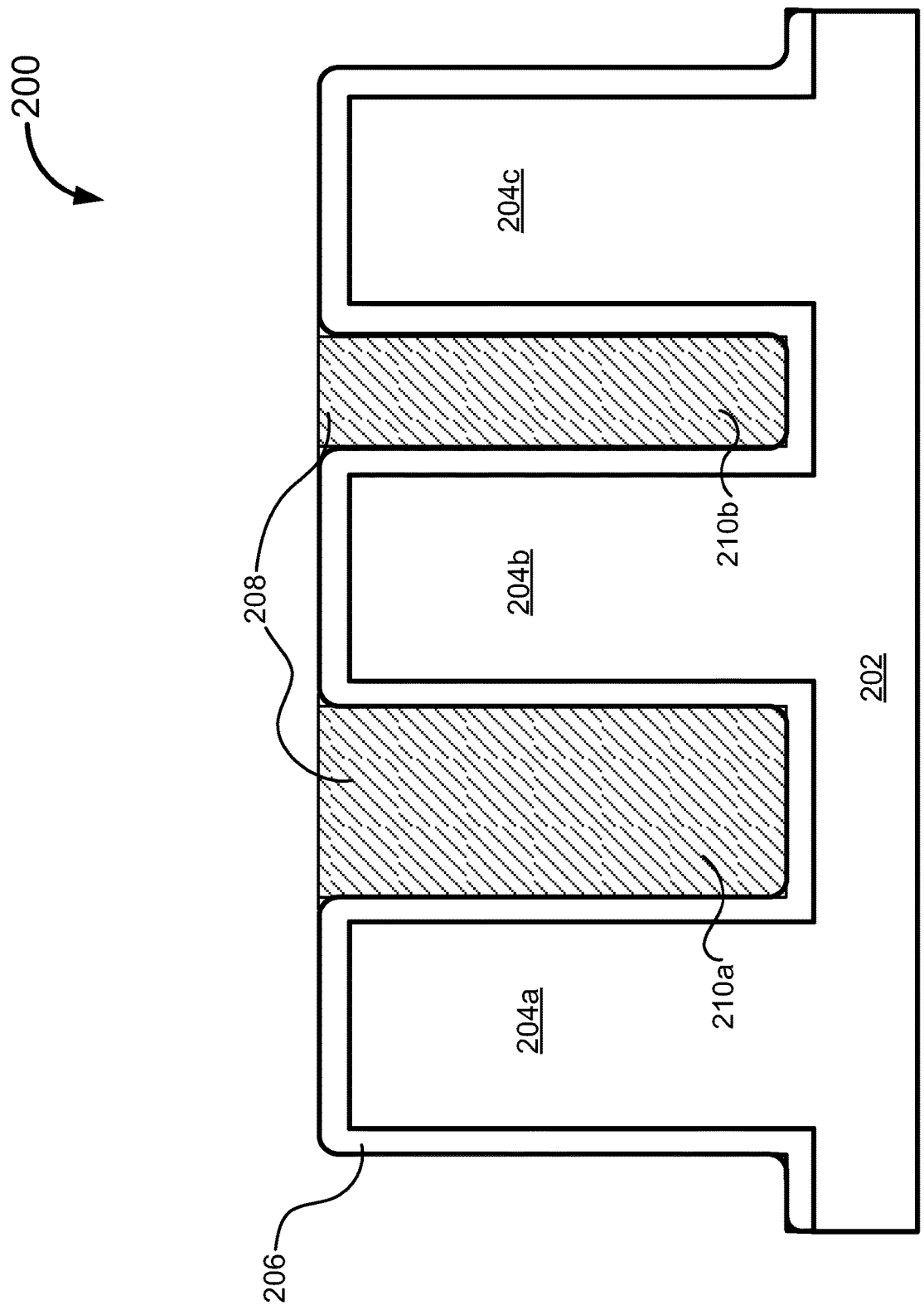

FIG. 2c shows the device 200 after removal of the portion of sacrificial layer 208 extending beyond the structures 204. According to various embodiments, the sacrificial layer 208 can be planarized with polish or etch back to be roughly even with the tops of the structures 204 or the buffer 206 disposed on top of the structures 204. While the sacrificial layer 208 is preferably planarized, according to various embodiments, the step may be neither necessary nor desirable and may, therefore, be omitted.

Figure 2D:
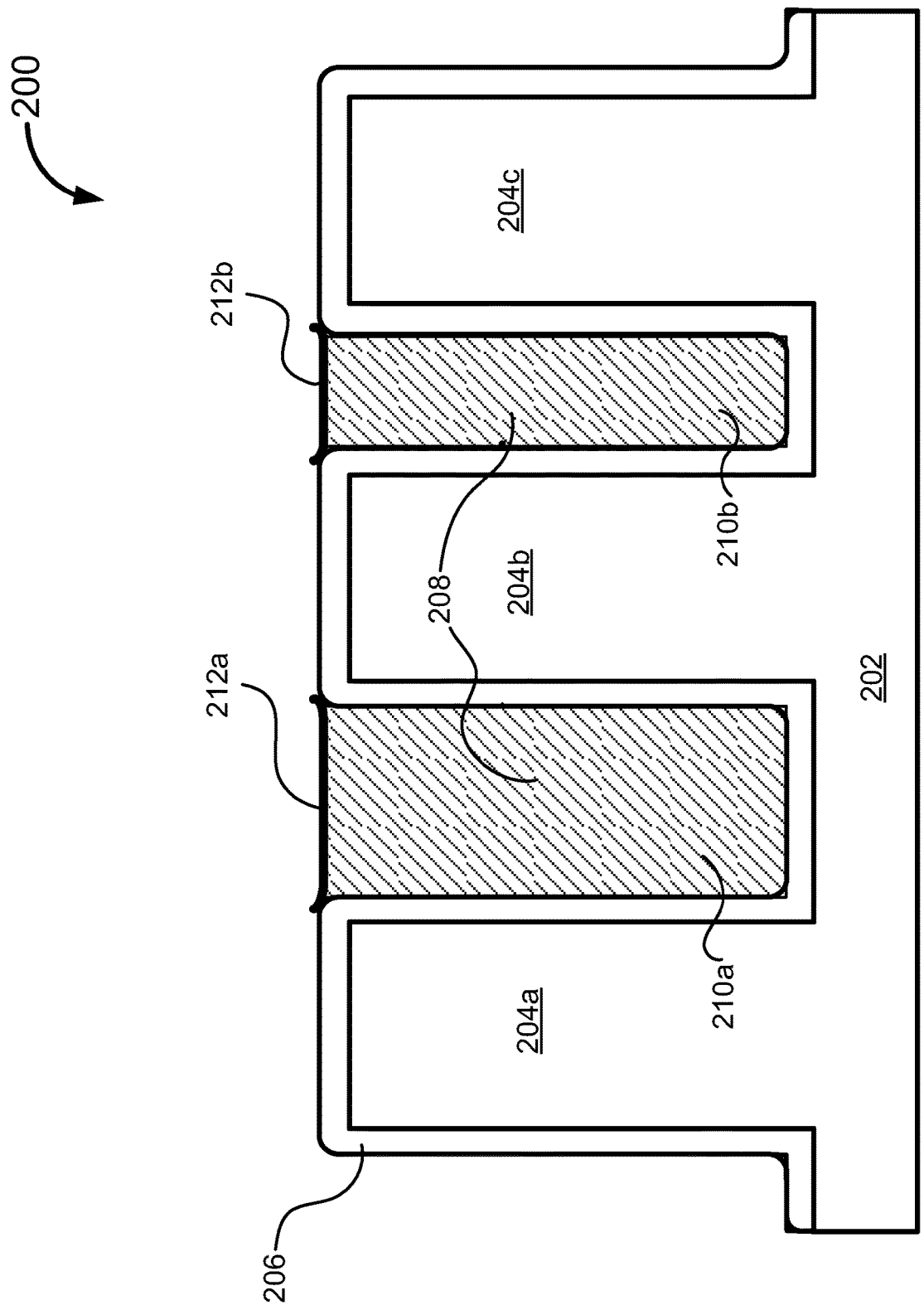

FIG. 2d depicts the device 200 after membranes 212a and 212b (collectively referred to herein as membrane layer 212) have been formed on top of the sacrificial layer 208. The membrane layer 212 is preferably a material that is porous to chemical species and etch products that can be used to etch the sacrificial layer 208. According to some embodiments, the membrane layer 212 may be formed out of a native oxide of Si or Al by light oxidation of the surface of the sacrificial layer 208 using oxidation species generated in plasma, a radical environment, or ozone. According to other embodiments, the membrane layer 212 may be formed onto the sacrificial layer by sputtering or deposition (e.g., chemical vapor deposition). In an embodiment, the membrane layer 212 may have a thickness around 5 Å to 200 Å (0.5 nm to 20 nm), but it may be thicker or thinner according to various embodiments. The membrane layer 212 may also be formed by forming a native oxide using a wet chemical treatment according to various embodiments. This native oxide formed by a wet chemical treatment will be a membrane with the thickness ranged 5 Å to 20 Å (0.5 nm to 2 nm). The wet chemical treatment can be implemented for inorganic materials such as Si, Al, and Ge of sacrificial layer. According to various embodiments, the wet chemical treatment may comprise a liquid that includes actively oxidize-spices such as $H_2O$, $H_2O_2$, $H_2SO_4$, $NH_4OH$, $HNO_3$.

Figure 2E:
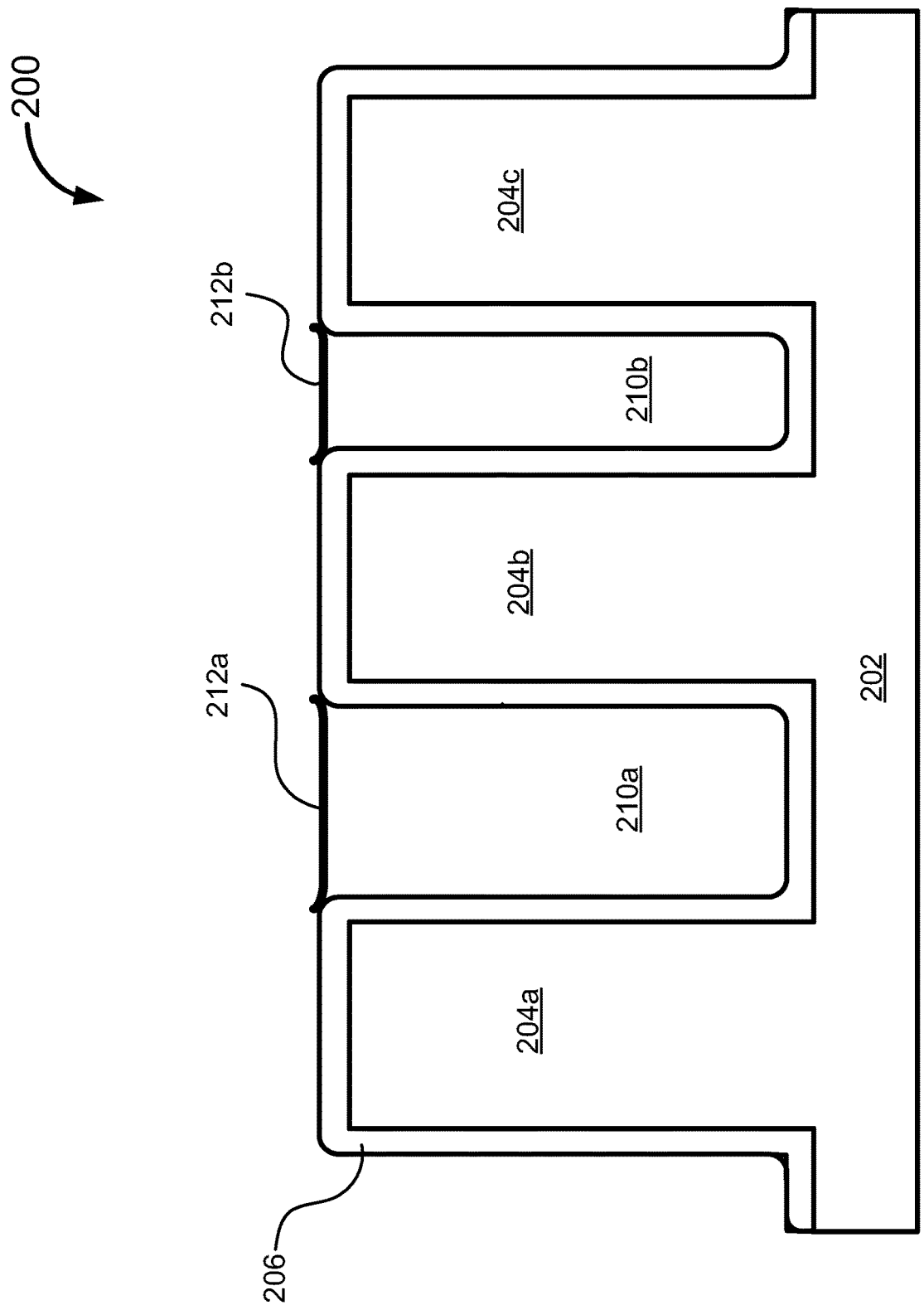

FIG. 2e depicts the device 200 after the sacrificial layer 208 has been etched leaving gaps 210a and 210b. As discussed, the sacrificial layer 208 is preferably etched using an etch product for which the membrane layer 212 is porous and that does not etch buffer layer 206. For instance, according to some embodiments, the sacrificial layer 208 may be etched using $Cl_2$, KOH, TMAH (tetra-methyl-amino-hydroxyl), or using gas phase etching with, for instance, $H_2$, HCl, $O_2$, $H_2O$ (vapor or gas), $O_3$, HF, $F_2$, and Carbon-Fluoride compounds with Cl2 and $XeF_2$. Additionally, according to some embodiments, a combination of etching products may be used.

Figure 2F:
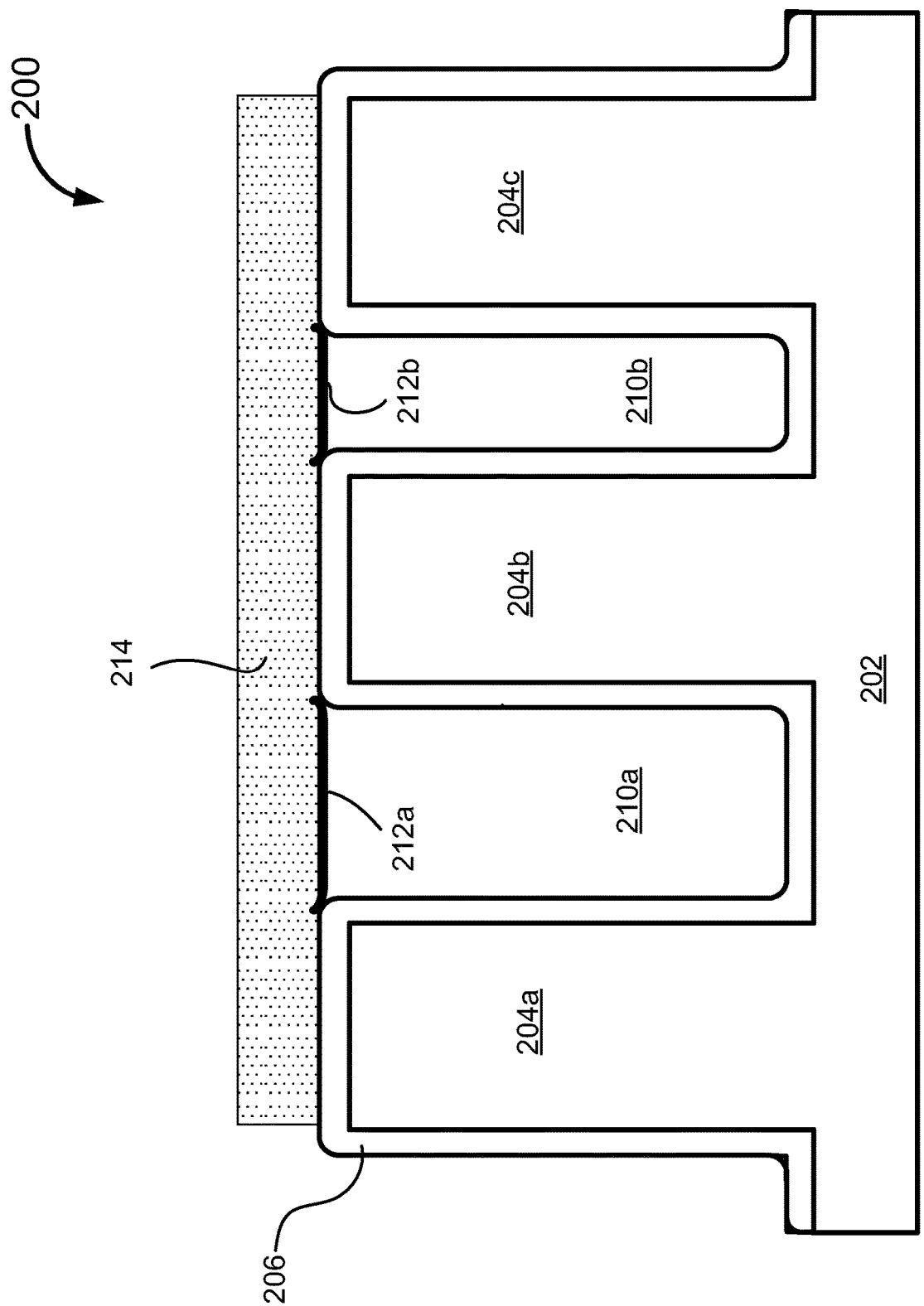

FIG. 2f depicts the device 200 after a cap layer 214 has been formed on top of the buffer layer 206 and the membrane layer 212. The cap layer 214 may be employed to seal the air gaps (the membrane 212 may be porous to air and thus not serve to seal the air gaps). According to various embodiments, the cap layer 214 can be formed using any material and process such as CVD of $SiO_2$, sputtered $Al_2O_3$, or SiN by high viscosity liquid source. The cap layer 214 preferably comprises a dielectric material, however, it may comprise any suitable material. For instance, according to some embodiments, the cap layer 214 may comprise metal layers, semiconducting layers, or a combination of dielectric, metal, and semiconducting layers, depending on the various requirements.

Thus, as can be seen in FIG. 2f, a semiconducting device 200 has been formed with a number of air gaps 210 after performing the steps depicted in FIGS. 2a-2c. As shown in FIG. 2f, air gaps 210a and 210b are covered by membrane layers 212a and 212b, respectively and by the cap layer 214. In contrast to the air gaps 110 depicted in FIG. 1, the air gaps 210 are entirely closed by the membrane layers 212 irrespective of the physical geometry of the placement of the structures 204 relative to one another. That is, despite the fact that structures 204a and 204b are further apart from one another than structures 204b and 204c, the air gaps formed between them, 210a and 210b, respectively, are both closed on top by membrane layer 212 and the cap layer 214. The semiconducting device 200 depicted in FIG. 2f, therefore, has reduced noise coupling and leakage when compared to the semiconducting device 100 from FIG. 1, and the formation is more controllable and can be accomplished with varying physical geometry.

Figure 2H:
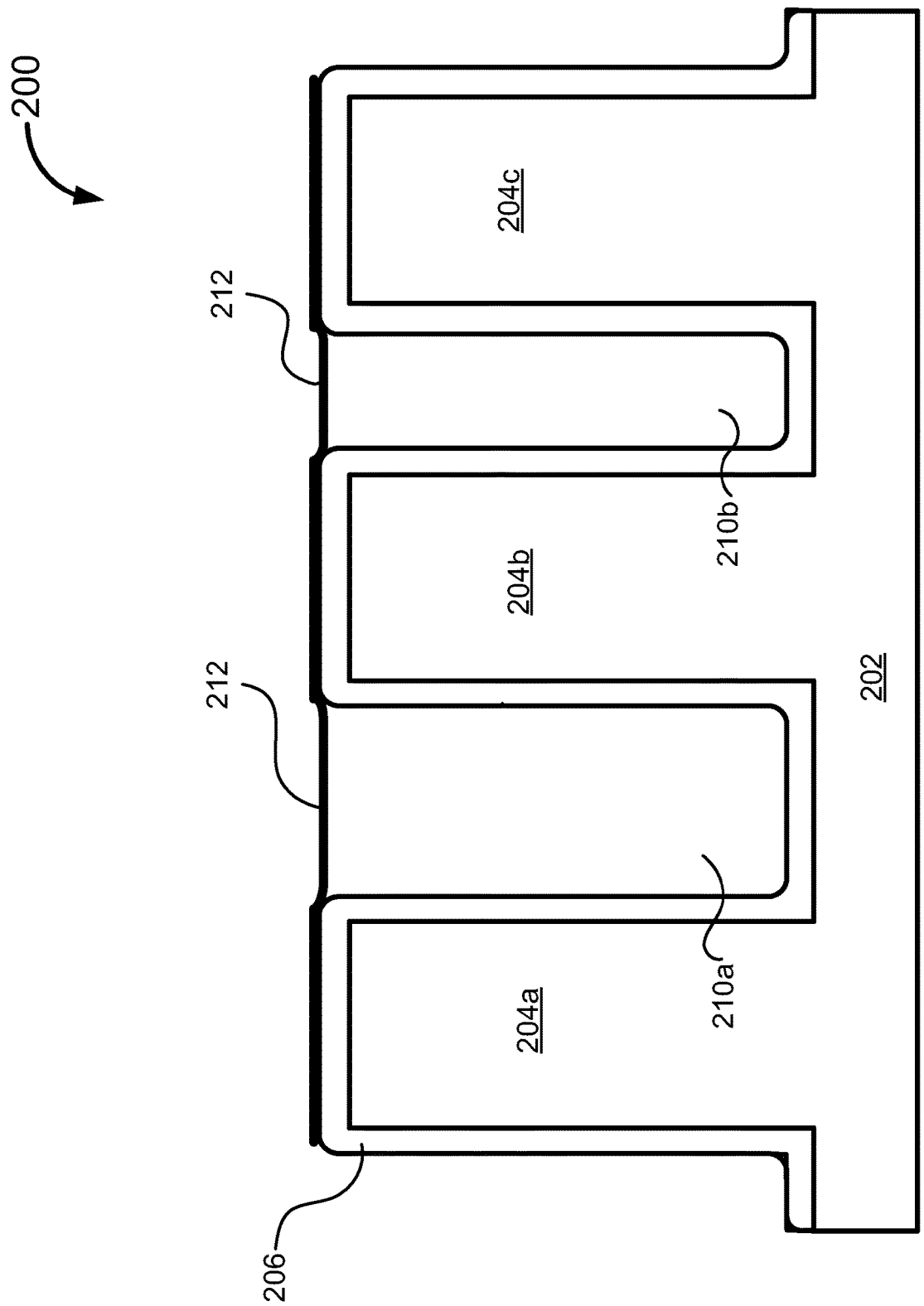
Figure 2I:
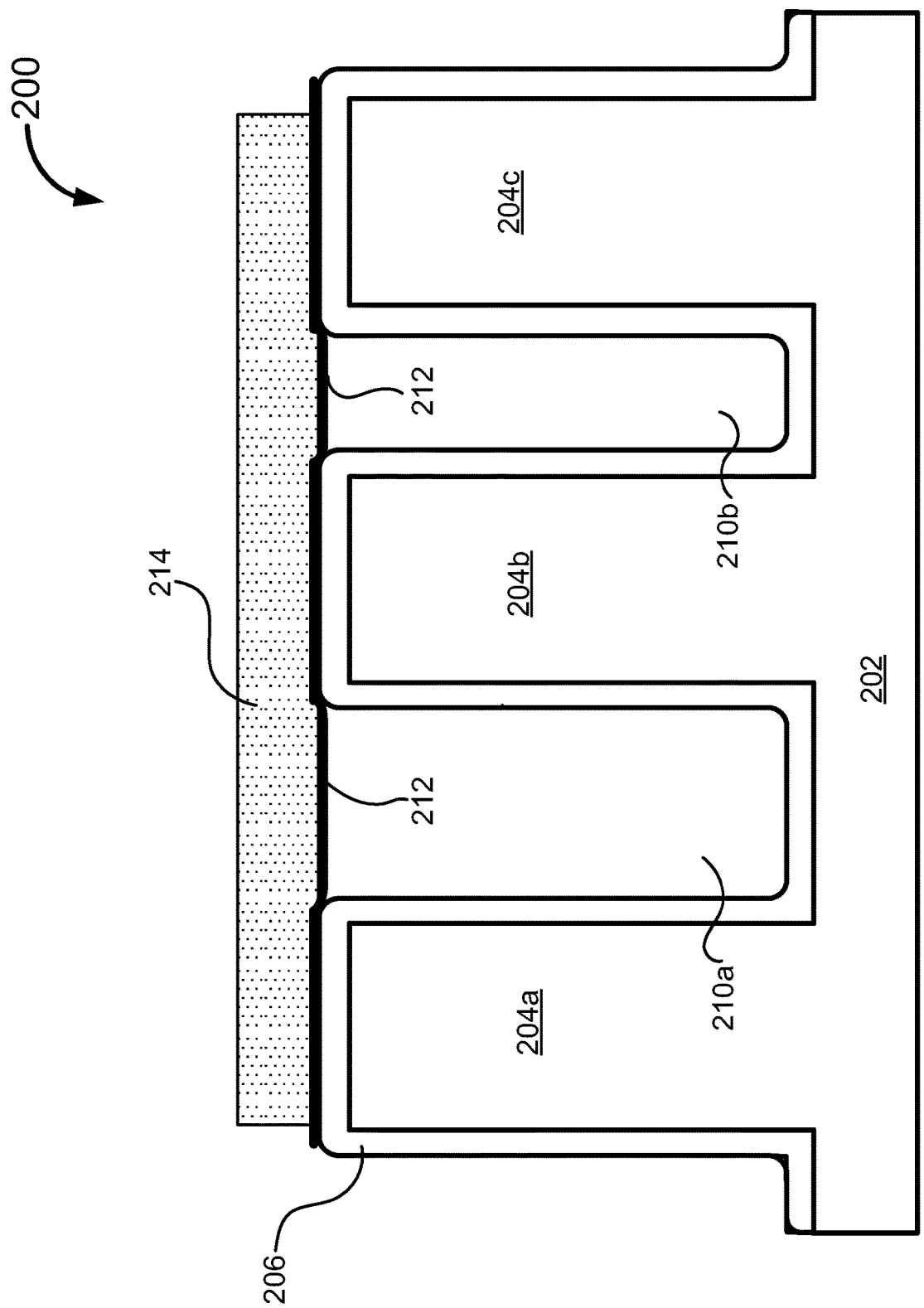

FIGS. 2g-2i depict an alternative embodiment where membrane layer 212 is deposited over the entire surface of device 200. FIG. 2g depicts the device 200 after membrane 212 has been formed on top of the sacrificial layer 208. As with the previous embodiments, membrane layer 212 is preferably a material that is porous to chemical species and etch products that can be used to etch the sacrificial layer 208. In one embodiment, membrane layer 212 may be a continuous structure that overlying the structures 204. According to some embodiments, the membrane layer 212 can be formed out of a native oxide of Si or Al by light oxidation of the surface of the sacrificial layer 208 using oxidation species generated in plasma, a radical environment, or ozone. According to other embodiments, the membrane layer 212 may be formed onto the sacrificial layer by sputtering or deposition (e.g., chemical vapor deposition). In an embodiment, the membrane layer 212 may have a thickness around 5 Å to 200 Å (0.5 nm to 20 nm), but it can be thicker or thinner according to various embodiments. The membrane layer 212 may also be formed by forming a native oxide using a wet chemical treatment according to various embodiments. This native oxide formed by a wet chemical treatment will be a membrane with the thickness ranged 5 Å to 20 Å (0.5 nm to 2 nm). The wet chemical treatment can be implemented for inorganic materials such as Si, Al, and Ge of sacrificial layer. According to various embodiments, the wet chemical treatment may comprise a liquid that includes actively oxidize-spices such as $H_2O$, $H_2O_2$, $H_2SO_4$, $NH_4OH$, $HNO_3$.

FIG. 2h depicts the device 200 after the sacrificial layer 208 has been etched leaving gaps 210a and 210b. The device 200 at this point is similar to the device 200 depicted in FIG. 2e, except that the membrane 212 layer is continuous. As discussed above, the sacrificial layer 208 is preferably etched using an etch product for which the membrane layer 212 is porous and that does not etch buffer layer 206. For instance, according to some embodiments, the sacrificial layer 208 may be etched using $Cl_2$, KOH, TMAH (tetra-methyl-amino-hydroxyl), or using gas phase etching with, for instance, $H_2$, HCl, $O_2$, $H_2O$ (vapor or gas), $O_3$, HF, $F_2$, and Carbon-Fluoride compounds with $Cl_2$ and $XeF_2$. Additionally, according to some embodiments, a combination of etching products may be used.

FIG. 2i depicts the device 200 after a cap layer 214 has been formed on top of the buffer layer 206 and the membrane layer 212. Again, the device 200 depicted in FIG. 2i is similar to the device 200 depicted in 2f except that the membrane layer 212 is continuous. As previously discussed, the cap layer 214 can be employed to seal the air gaps (the membrane 212 may be porous to air and thus not serve to seal the air gaps). According to various embodiments, the cap layer 214 can be formed using any material and process such as CVD of $SiO_2$, sputtered $Al_2O_3$, or SiN by high viscosity liquid source. The cap layer 214 preferably comprises a dielectric material, however, it may comprise any suitable material. For instance, according to some embodiments, the cap layer 214 may comprise metal layers, semiconducting layers, or a combination of dielectric, metal, and semiconducting layers, depending on the various requirements.

Figure 3:
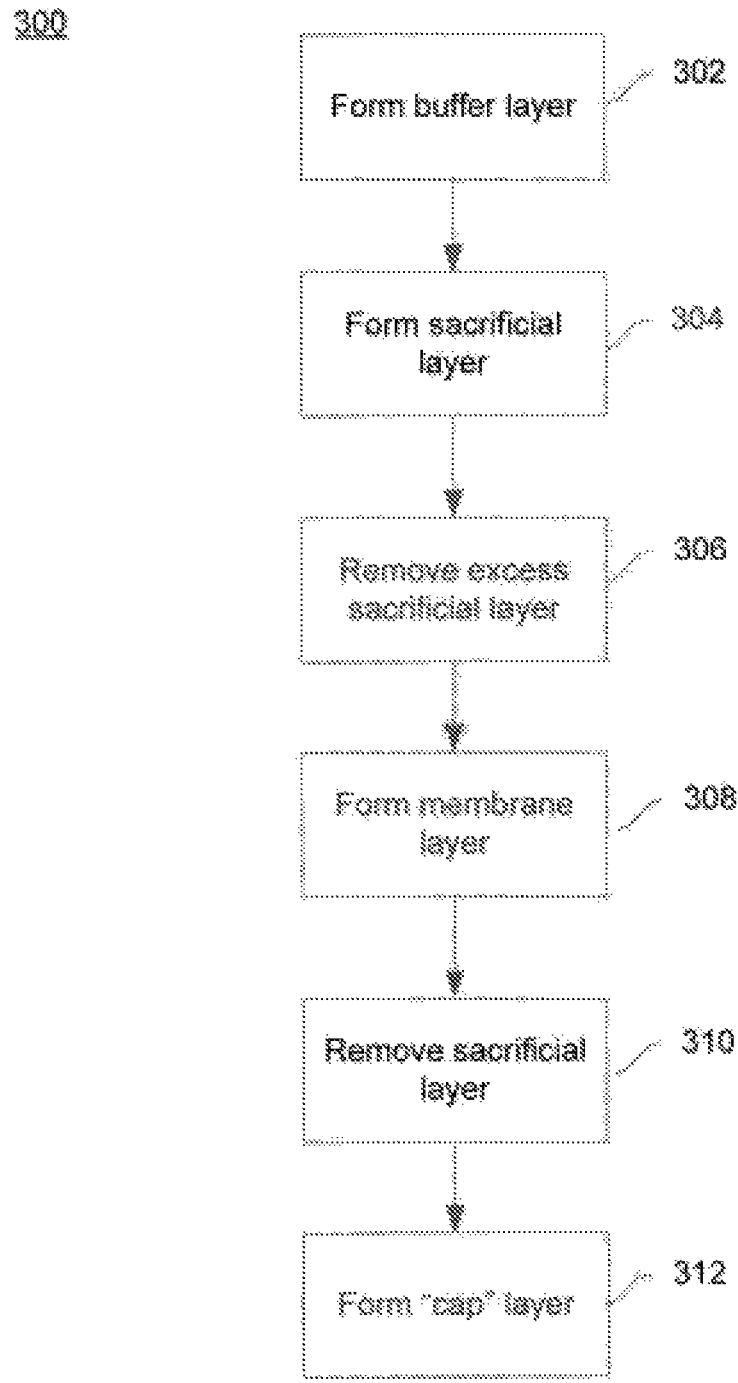
FIG. 3 is a flow chart illustrating a method of producing a semiconducting device with air gaps used as insulators according to embodiments of the invention.

FIG. 3 is a flowchart illustrating a process 300 of constructing a semiconducting device that uses an air gap as insulation according to various embodiments. For the purposes of illustration, flowchart 300 will be described with continuing reference to FIGS. 2a-2f, though the invention is not limited to this example. At step 302 a buffer layer 206 can be formed on semiconductor device structures 204 (FIG. 2a). The buffer layer 206 preferably comprises a dielectric such as $SiO_2$ and is conformal. According to some embodiments, the buffer layer 206 can be formed by deposition using CVD, PECVD, ALD, or any of the other well-known deposition methods outlined above.

At step 304, a sacrificial layer 208 is deposited on top of the buffer layer 206 and between device structures 204 (FIG.

2b). The sacrificial layer 208 may comprise any material that has an etching or polishing selectivity with the buffer layer 206. That is, the sacrificial layer 208 may be any material that can be etched by processes or means that will have little or no effect on the buffer layer 206. In some embodiments, the sacrificial layer 208 may comprise Si, Al, or an organic film such as photo resist.

At step 306, the excess sacrificial layer 208 is removed by, for instance, polishing or etching (FIG. 2c). According to embodiments of the invention, the sacrificial layer 208 can be removed so that the top of the structures 204 are exposed and that the sacrificial layer 208 is substantially flush with the top of the structure 204 or the buffer layer 206. Alternatively, the sacrificial layer 208 can be removed such that it is concave with respect to the top of the structures 204 or buffer layer 206.

At step 308, the membrane layer 212 can be formed over the remaining portion of the sacrificial layer 208 (FIG. 2d). According to some embodiments, the membrane layer 212 may be formed over the entirety of the device, i.e., over both the sacrificial layer and the top portion of the structures 204/buffer layer 206. The membrane layer 212 may be comprised of any material that will allow etch chemical species and/or etch product to pass through to the sacrificial layer 208. For instance, according to some embodiments, the membrane layer 212 comprises a native oxide of Si or Al (depending on the composition of the sacrificial material) and can be formed by light oxidation of the surface of the using oxidation species that are generated in a plasma/radical environment or in ozone. In some embodiments, the membrane layer 212 may be formed onto the sacrificial layer 208 by sputtering or deposition.

At step 310, the sacrificial layer 208 can be removed from the device 200 by selective etching thereby leaving air gaps 210 in the spaces 210 once occupied by the sacrificial layer 208 (FIG. 2e). The sacrificial layer 208 may be etched using gasses that pass through the membrane layer 212 and react with the materials of the sacrificial layer 208, but that do not or substantially do not react with the material comprising the membrane 212 or buffer 206. That is, the process of etching the sacrificial material 208 leaves the membrane layer 212 and buffer 206 intact. The buffer layer 206 does not react with the products used to etch the sacrificial layer 208 according to various embodiments and can, therefore, use to isolate the structures 204 from the effects of the etching product. According to some embodiments, the buffer layer 206 may partially react or react more slowly with the etching product than the sacrificial layer 208. However, in such embodiments, the buffer layer 206 can be made of sufficient thickness to still isolate the structures 204 from the effects of the etching product.

At step 312, a cap layer is formed or top of the membrane layer the cap layer 214 can be employed to deal the air gaps. According to various embodiments, the cap layer 214 can be used for any material and process such as CVD of $SiO_2$, sputtered $Al_2O_3$, or SiN by high viscosity liquid source. While, in an embodiment, the cap layer 214 comprises a dielectric material, it may sometimes be desirable to form it of metal layers, depending on the various requirements.

Figure 4:
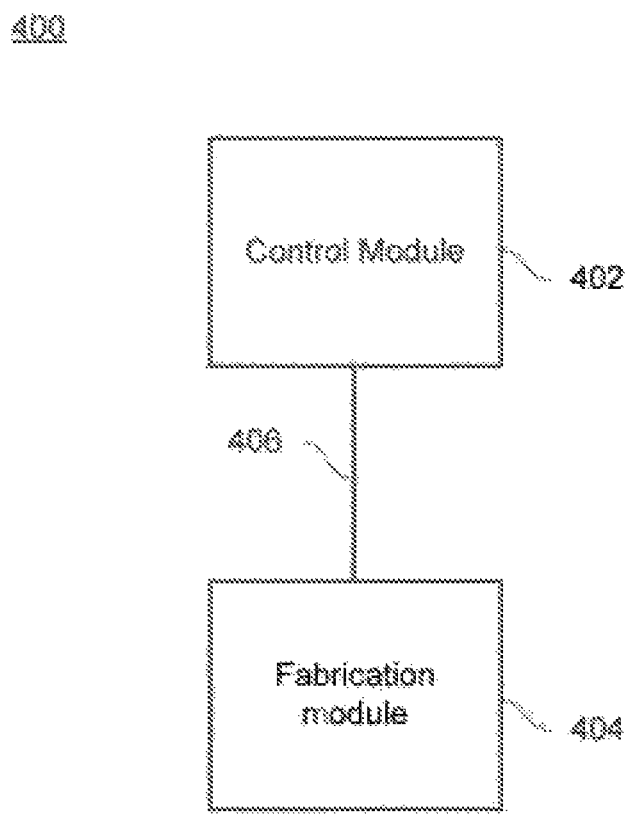
FIG. 4 is a functional block diagram of an apparatus used to produce a semiconducting device according to embodiments of the invention.

FIG. 4 is a functional block diagram of an apparatus 400 for producing a semiconducting device such as device 200 according to various embodiments of the invention. The apparatus includes a control module 402 connected to a fabrication module 404 by a communication link 406. According to various embodiments, the control module 402 may comprise any well-known general purpose computer containing a memory that stores computer instructions and a processor for executing the computer instructions.

The fabrication module 404 can include semiconductor fabrication equipment of any number of well-known types. The control module 402 can contain computer instructions, that when executed, cause control signals to be sent to the fabrication module 404 via the communication link 406. The control signals can cause the fabrication module 404 to produce a semiconducting device according to method 300 depicted in FIG. 3 and as shown in FIGS. 2a-2f, according to embodiments. For instance, the signals could be configured to cause the fabrication module 404 to form a sacrificial layer 208 between two structures 204 in a semiconducting device 200. Additionally, according to embodiments, the signals could cause the fabrication module 404 to form a membrane layer 212 over the sacrificial layer, where the membrane layer is porous to an etch product. The fabrication module 404 could also be made to etch the sacrificial layer 208 through the membrane layer 212 and between the structures 204 to create an air gap 210. According to embodiments, the sacrificial layer 208 is etched without etching the membrane layer 212 or a buffer layer 206.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
    forming a sacrificial layer between a first structure and a second structure;
    removing a portion of the sacrificial layer disposed above the first and second structures;
    forming a membrane layer, subsequent to removing the portion of sacrificial layer, completely over a remaining portion of the sacrificial layer, the membrane being porous to an etch product and not covering the first and second structures completely; and removing the remaining portion of the sacrificial layer at least partly through the membrane layer to create an air gap between the first structure and the second structure, wherein the remaining portion of the sacrificial layer is removed using the etch product without etching the membrane layer.

2. The method of claim 1, further comprising forming a buffer layer directly on and to cover the first and second structures, wherein the sacrificial layer is formed over the buffer layer.

3. The method of claim 1, further comprising forming a cap layer above the membrane layer.

4. The method of claim 3, wherein the cap layer comprises a dielectric material.

5. The method of claim 1, wherein removing the portion of the sacrificial layer further comprising planarizing the sacrificial layer prior to forming the membrane material.

6. The method of claim 1, wherein the membrane layer is formed such that it overlaps a portion of the first structure and a portion of the second structure.

7. The method of claim 1, wherein at least one of the first and second structures comprises a transistor, a capacitor, an electrode, a contact, or an interconnect.

8. The method of claim 1, wherein the membrane layer is formed by sputtering or deposition.

9. The method of claim 1, wherein the sacrificial layer comprises at least one of silicon, aluminum, germanium, tungsten, photo resist, and an organic film.

10. A method of fabricating a semiconductor device, comprising:

forming a buffer layer over first and second structures of the semiconductor device, wherein the buffer layer is formed completely overlying a gap between the first and second structures;

forming a sacrificial layer overlying the buffer layer such that the gap is completely filled;

removing the sacrificial layer outside the gap;

forming a membrane on the sacrificial layer, wherein the membrane is formed by oxidizing a top portion of the sacrificial layer inside the gap; and removing the sacrificial layer within the gap through the membrane to form an air gap, wherein the sacrificial layer is removed using an etch product that the membrane is porous for.

11. The method of claim 10, wherein the sacrificial layer includes at least one of aluminum, silicon, and germanium.

12. The method of claim 10, wherein removing the sacrificial layer outside the gap includes:

planarizing the sacrificial layer such that a top surface of the sacrificial layer within the gap is substantially flush with a top surface of the buffer layer above the first and second structures.

13. The method of claim 10, wherein removing the sacrificial layer that is outside the gap create a concave top surface of the sacrificial layer within the gap.

14. The method of claim 10, wherein the etch product is selected to be substantially unreactive to the buffer layer.

15. The method of claim 10, wherein oxidizing the top portion of the sacrificial layer inside the gap includes using oxidation species that are generated in a plasma environment, a radical environment, or in ozone.

16. A method, comprising:

forming sacrificial layers within a first gap between first and second structures and a second gap between the second structure and a third structure, wherein the first, second, and third structures are adjacent to one another;

removing a portion of the sacrificial layers that are outside the first gap, the second gap, and disposed above the first and second structures;

forming a first membrane overlying the sacrificial layer within the first gap and a second membrane overlying the sacrificial layer within the second gap, wherein the first and second membranes are not physically in contact; and removing the sacrificial layer within the first gap through the first membrane and the sacrificial layer within the second gap through the second membrane to form first and second air gaps, respectively.

17. The method of claim 16, wherein the sacrificial layers include at least one of silicon, aluminum, and germanium.

18. The method of claim 16, wherein forming the first and second membranes include:

oxidizing a top portion of the sacrificial layers within the first and second gaps.

19. The method of claim 16, wherein the first and second membranes are formed by sputtering or deposition.

20. The method of claim 16, further comprising:

forming a buffer layer between the sacrificial layers and the first, second, and third structures, wherein the buffer layer is formed by conformal deposition.

* * * * *